(12) United States Patent
Tsai

(10) Patent No.: US 11,613,065 B2
(45) Date of Patent: Mar. 28, 2023

(54) IMPRINT METHOD USING A SOLUBLE MOLD AND ITS RELATED IMPRINT SYSTEM

(71) Applicant: EVER RADIANT INCORPORATION, Tainan (TW)

(72) Inventor: Sung-Wen Tsai, Tainan (TW)

(73) Assignee: EVER RADIANT INCORPORATION, Tainan (TW)

( * ) Notice: Subject to any disclaimer, the term of this patent is extended or adjusted under 35 U.S.C. 154(b) by 361 days.

(21) Appl. No.: 16/738,201

(22) Filed: Jan. 9, 2020

(65) Prior Publication Data

US 2021/0101328 A1 Apr. 8, 2021

(30) Foreign Application Priority Data

Oct. 4, 2019 (TW) .................................. 108135978

(51) Int. Cl.
*B29C 59/00* (2006.01)
*B29K 29/00* (2006.01)

(52) U.S. Cl.
CPC .......... *B29C 59/002* (2013.01); *B29C 59/005* (2013.01); *B29K 2029/00* (2013.01)

(58) Field of Classification Search
CPC ............................ B29C 59/002; B29C 59/005
USPC ......... 425/385; 264/293, 313, 334, 219–221, 264/225

See application file for complete search history.

(56) References Cited

U.S. PATENT DOCUMENTS

| | | | | |
|---|---|---|---|---|
| 6,849,558 B2* | 2/2005 | Schaper | .................. | B29C 33/52 438/758 |
| 7,125,510 B2* | 10/2006 | Huang | .................... | B29C 39/10 264/225 |
| 7,811,486 B2* | 10/2010 | Karim | .................. | A61C 13/087 264/17 |
| 8,382,466 B2* | 2/2013 | Hubert | .................. | B82Y 40/00 264/293 |
| 8,940,117 B2* | 1/2015 | Slafer | ..................... | C23C 16/44 264/293 |
| 2005/0287319 A1* | 12/2005 | Miyazawa | .............. | C04B 35/63 428/34.1 |
| 2006/0249886 A1* | 11/2006 | Chao | ...................... | B82Y 40/00 264/293 |
| 2010/0323184 A1* | 12/2010 | Toyota | ................. | G02B 5/0278 264/219 |
| 2014/0188041 A1* | 7/2014 | Moore | ............. | A61M 37/0015 264/309 |
| 2015/0297878 A1* | 10/2015 | Singh | ................... | A61K 9/0021 264/334 |

* cited by examiner

*Primary Examiner* — Jeffrey M Wollschlager
*Assistant Examiner* — Xue H Liu
(74) *Attorney, Agent, or Firm* — WPAT, PC

(57) ABSTRACT

An imprint method provided herein includes the steps of: adding a soluble material to a master mold; solidifying the soluble material to form a soluble mold having a mold pattern; adhering a dissociable tape to the soluble mold to separate the soluble mold from the master mold; placing the soluble mold onto a polymer layer of a workpiece for imprint; applying a high temperature and a pressure to the soluble mold to allow the polymer layer having an imprint pattern corresponding to the mold pattern and solidification, and to dissociate the tape; and providing a solvent to dissolve the soluble mold to obtain an imprint workpiece having the imprint pattern.

12 Claims, 8 Drawing Sheets

IMPRINT METHOD USING A SOLUBLE MOLD AND ITS RELATED IMPRINT SYSTEM

CROSS REFERENCE

This non-provisional application claims priority of Taiwan Invention Patent Application No. 108135978, filed on Oct. 4, 2019, the contents thereof are incorporated by reference herein.

FIELD OF THE INVENTION

The present invention is related to an imprint method, and particularly to an imprint method using a soluble mold and a related imprint system thereof.

BACKGROUND OF THE INVENTION

In an electronic product, e.g. a display device or an illuminating lamp, an optical element controls optical property including light reflection or light diffraction through nanoscale-to-microscale fine structures. Such fine structures can be formed through photolithography, electron beam lithography, imprint, or molecular transfer lithography.

The so-called "imprint" is performed by transferring a mold pattern onto an article to form a fine structure thereon. Removing the mold from the transfer article is a process called "mold release." Based on the good adherence between the mold and the transfer article, a part of the mold remains on the transfer article after mold release. This not only can increase damage rate of the mold, but also make the fine structure defective. American Patent U.S. Pat. No. 6,849,558B2 and American Patent Publication US2006/0249886A1 both disclose the use of a water-soluble mold made of polyvinyl alcohol (PVA). This type of a soluble mold is produced by injecting a soluble material into a master mold to cure and then removing the mold from the master mold using a preform. As described in Journal of Vacuum Science & Technology B 21, 2961 (2003), the preform is made of the same material as the soluble material, and it must be attached to the soluble material before the soluble material is completely cured. Generally, the concentration and the thickness of the soluble material can affect the curing time, and therefore it depends on the operator's expertise and experience at what curing level the preform is attached to the soluble material.

The so-called "molecular transfer lithography" is performed by placing a mold filled with a photoresist material in its holes onto an article, and then forming a fine structure at the position of the article uncovered with the photoresist material by lighting and etching. As described in Nanotechnology 24 (2013) 085302 (6pp), although the mold is soluble, it needs to be evenly distributed on the article using a roller. This leads to the deformation of the later-formed fine structure resulted from expanding the structure spaces.

SUMMARY OF THE INVENTION

Therefore, the present invention provides an imprint method, which includes the steps of: adding a soluble material to a master mold; solidifying the soluble material to form a soluble mold having a mold pattern; adhering a dissociable tape to the soluble mold to separate the soluble mold from the master mold; placing the soluble mold onto a polymer layer of a workpiece for imprint; applying a high temperature and a pressure to the soluble mold to allow the polymer layer having an imprint pattern corresponding to the mold pattern and solidification, and to dissociate the tape; and providing a solvent to dissolve the soluble mold to obtain an imprint workpiece having the imprint pattern.

The present invention also provides an imprint method, which includes the steps of: adding a soluble material to a master mold; solidifying the soluble material to form a soluble mold having a mold pattern; adhering a dissociable tape to the soluble mold to separate the soluble mold from the master mold; placing the soluble mold onto a polymer layer of a workpiece for imprint; applying a first high temperature and a pressure to the soluble mold to allow the polymer layer having an imprint pattern corresponding to the mold pattern and to dissociate the tape; applying a second high temperature to the soluble mold to allow the polymer layer solidification, the second high temperature higher than the first high temperature; and providing a solvent to dissolve the soluble mold to obtain an imprint workpiece having the imprint pattern.

Preferably, the tape adhering step to the soluble mold includes the steps of: surrounding the soluble mold with a ring frame, the ring frame having a supporting portion and an operating portion, the supporting portion connected to the operating portion to form a L-type structure; attaching the dissociable tape to the soluble mold, a protrusion portion of the dissociable tape attached to the supporting portion; and applying a sideways peeling force to the operating portion of the ring frame to remove the soluble mold from the master mold.

Preferably, the dissociable tape is made of a heat-dissociable foam adhesive.

Preferably, the soluble mold has a first alignment mark; the soluble-mold placing step onto the polymer layer includes the steps of: positioning the workpiece for imprint onto a machine platform, the workpiece further having a substrate layer between the polymer layer and the machine platform, and the machine platform having a second alignment mark; positioning the soluble mold onto the polymer layer on the machine platform; determining whether the first alignment mark and the second alignment mark are aligned to each other; and if the two alignment marks are aligned to each other, performing the high temperature and pressure applying step; or if the two alignment marks are not aligned to each other, adjusting an x-axis position and a y-axis position of the soluble mold and a θ angle formed between the soluble mold and an x-y plane using the machine platform as the x-y plane, until the two alignment marks are aligned to each other.

Preferably, the high temperature and pressure applying step includes: applying a positive pressure on a surface of the soluble mold away from the polymer layer; and/or applying a negative pressure on another surface of the soluble mold facing the polymer layer.

Preferably, the soluble material is polyvinyl alcohol, and the solvent is water.

According to the present invention, after complete solidification of the soluble material, the dissociable tape is adhered to the soluble mold, which leads to the convenience of taking the soluble mold out of the master mold. As such, the operation prevalence is increased. Further, by deposition of the two alignment marks, the soluble mold can be accurately positioned onto the polymer layer so that the imprint pattern can be accurately formed on the predetermined position of the polymer layer. By such a way, on condition that the imprint workpiece is used as an optical element, it can provide accurate and good optical property. Since the imprint workpiece does not have any alignment mark thereon, there is no interference of alignment mark with the optical property of an optical element.

Within the scope of the present invention, an imprint system is also disclosed, which includes: a machine platform having a first alignment mark for positioning a workpiece for imprint, a soluble mold, and a dissociable tape thereon, the soluble mold positioned on a polymer layer of the workpiece and having a mold pattern and a second alignment mark, and the dissociable tape adhered to the soluble mold; and a camera positioned at a side of the machine platform away from the workpiece for determining whether the first alignment mark and the second alignment mark are aligned to each other.

Preferably, the system further includes: an imprint element provided for applying a first high temperature and a pressure to the soluble mold to allow the polymer layer having an imprint pattern corresponding to the mold pattern and solidification and to dissociate the tape.

Preferably, the system further includes: a position-adjusting element provided for adjusting an x-axis position and a y-axis position of the soluble mold and a θ angle formed between the soluble mold and an x-y plane using the machine platform as the x-y plane if the two alignment marks are not aligned to each other.

Preferably, the system further includes: a dissolving element provided for providing a solvent to dissolve the soluble mold to obtain an imprint workpiece having the imprint pattern.

According to the present invention, the camera and the soluble mold are positioned at two opposite sides of the machine platform, and therefore the liquid or the volatile gas produced from the soluble-mold dissolution can't contaminate the camera. By such a way, there is no need to clean the camera for the next imprint.

DETAILED DESCRIPTION OF THE INVENTION

The detailed description and preferred embodiments of the invention will be set forth in the following content, and provided for people skilled in the art to understand the characteristics of the invention.

Figure 1:
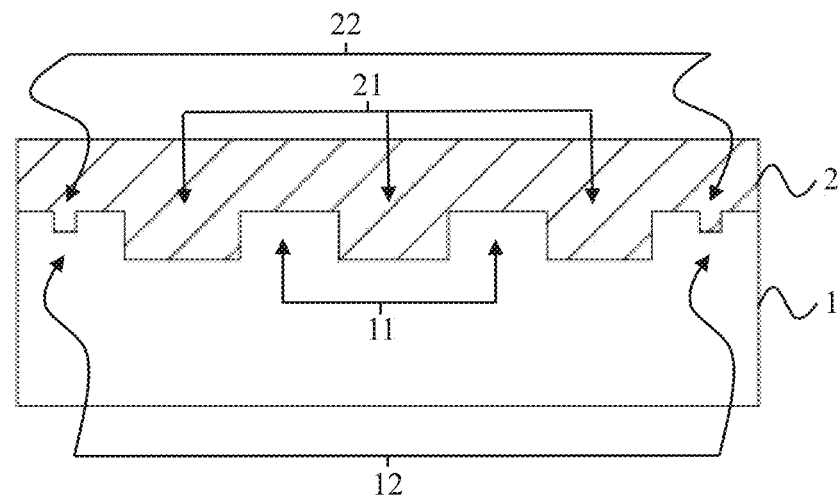
FIGS. 1-6 are a series of cross-sectional views illustrating an imprint method according to an embodiment.
Figure 7:
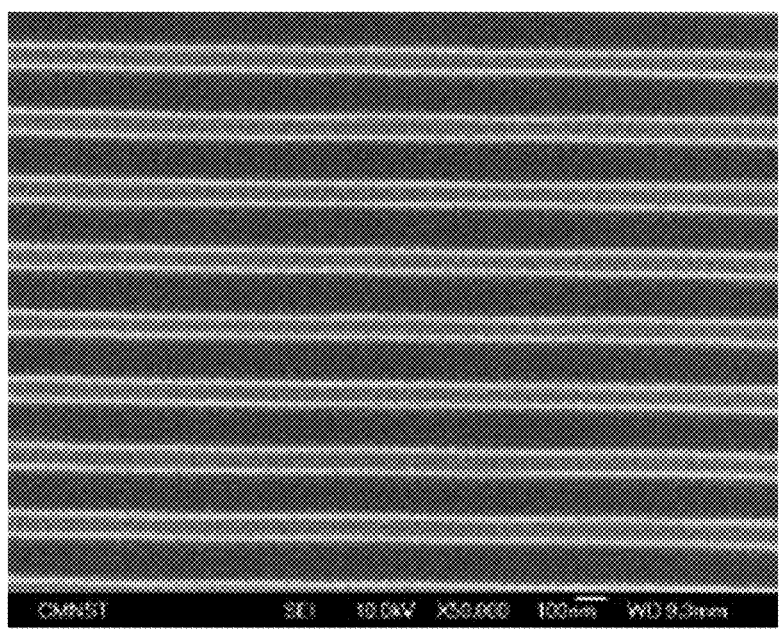
FIG. 7 is a scanning electron microscopic (SEM) picture showing the top view of an imprint workpiece having the imprint pattern.
Figure 8:
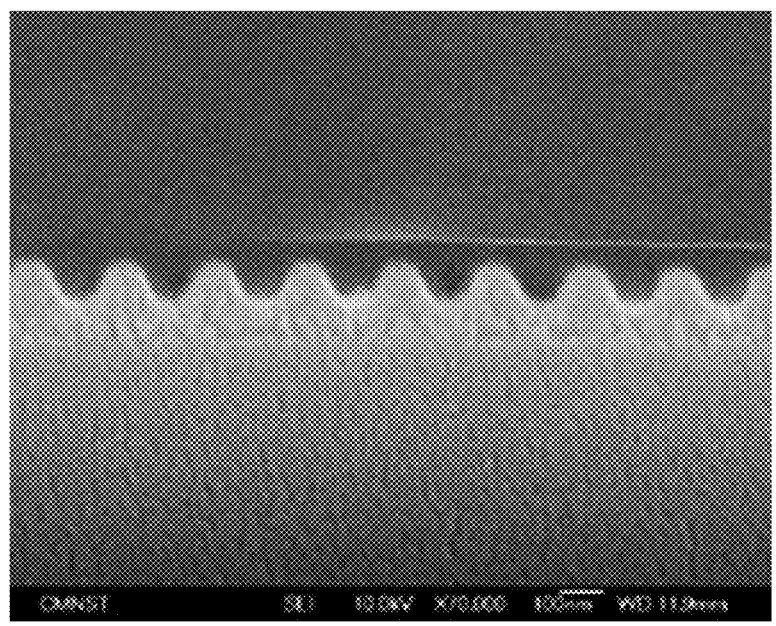
FIG. 8 is a scanning electron microscopic picture showing the side view of the foregoing imprint workpiece.

As shown in FIGS. 1-6, an imprint method according to an embodiment is illustrated, wherein the obtained imprint workpiece (4) has an imprint pattern (43). As shown in FIGS. 7 and 8, the imprint pattern (43) is not only formed on the imprint workpiece (4), but also has a profile without structure defects. The detailed steps of the exemplary method are described as below:

As shown in FIG. 1, a soluble material is added to a master mold (1) which has a mold structure (11) and a mark structure (12), and then the soluble material is solidified to form a soluble mold (2) which has a mold pattern (21) corresponding to the mold structure (11) and a first alignment mark (22) corresponding to the mark structure (12). In a preferred example, the soluble material is polyvinyl alcohol, and its thickness on the master mold (1) is of 10-1000 μm. Accordingly, the latterly-obtained mold (2) is not only soluble, but also flexible. The soluble material may be added in a solution form, and its concentration in the solution may be of, but not limited to, 5-50 wt %. In case that its concentration is of less than the lower limit value, the probability for making the mold pattern (21) incomplete may increase so that the mold pattern (21) is defective and the imprinting quality lowers. The soluble material may be added through spin coating or slot-die coating, and the spin rate for spin coating may be of, but not limited to, 100-5000 rpm. In a preferred example, the master mold (1) is made of silicon. Additionally, the solidifying used herein may be heat-solidifying or photo-solidifying (e.g. UV-solidifying); the temperature for heat-solidifying may be of 80-160° C. and the time therefor may be of 5-60 minutes, but not limited thereto. In case that the time is of more than the upper limit value, the peeling difficulty for the soluble mold (2) may increase so that the mold pattern (21) is formed with defects.

Figure 2:
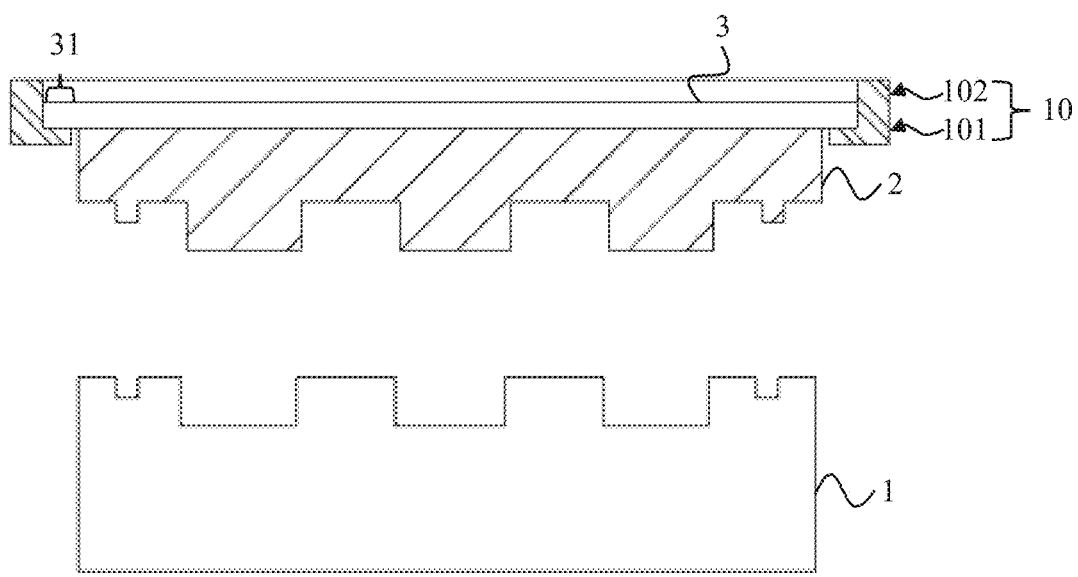

As shown in FIG. 2, a dissociable tape (3) is adhered to the soluble mold (2) and the soluble mold (2) is separated from the master mold (1). The dissociable tape (3) may be, but not limited to, a heat-dissociable tape. In a preferred example, the dissociable tape (3) is made of heat-dissociable foam adhesive, e.g. polystyrene (PS) adhesive or polyurethane (PU) adhesive, and its thickness is of 100-1000 μm. For conveniently peeling the soluble mold (2), it is preferable that the area of the tape (3) is greater than that of the mold (2) so that a protrusion portion (31) is formed at two ends of the tape (3) for griping. For conveniently peeling the soluble mold (2), before the tape (3) adhering, a ring frame (10) is also used to surround the soluble mold (2), and has a supporting portion (101) and an operating portion (102) connected to each other to form a L-type structure; after the tape (3) attaching, the protrusion portion (31) of the tape (3) is attached to the supporting portion (101) of the ring frame (10), and then a sideways peeling force is applied to the operating portion (102) to remove the mold (2) from the master mold (1).

Figure 3:
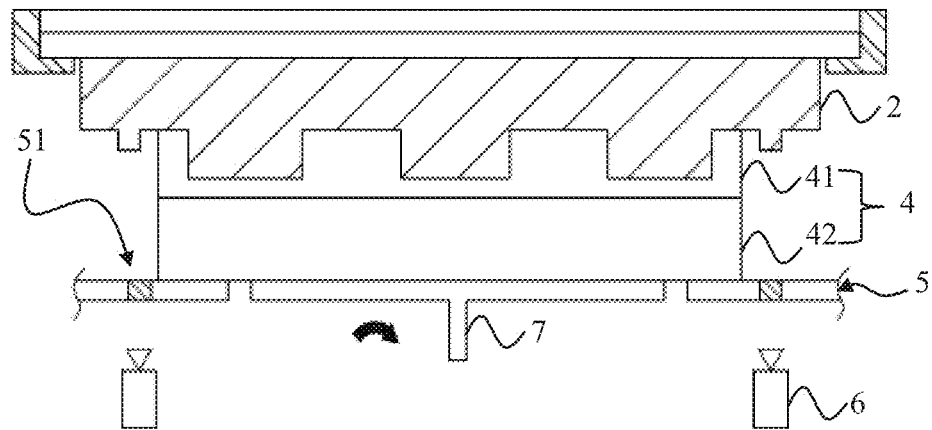

As shown in FIG. 3, the soluble mold (2) is placed onto a polymer layer (41) of a workpiece (4) for imprint. In detail, a substrate layer (42) is placed on a machine platform (5) which has a second alignment mark (51); the polymer layer (41) is then formed on the substrate layer (42); the soluble mold (2) is then positioned onto the polymer layer (41) on the substrate layer (42); finally, a camera (6) is used to determine whether the first alignment mark (22) and the second alignment mark (51) are aligned to each other. If the two alignment marks (22 & 51) are aligned to each other, the following step is performed; however, if not, a position-adjusting element (7) is used to adjust an x-axis position and a y-axis position of the soluble mold (2) and a θ angle formed between the soluble mold (2) and an x-y plane using the machine platform (5) as the x-y plane until the two alignment marks (22 & 51) are aligned to each other. Additionally, a polymer material having a glass transition temperature (Tg) of less than that of the mold (2) may be coated with spinning onto the substrate layer (42), and then soft baked to form the polymer layer (41). In a preferred example, the glass transition temperature of the polymer material is of 20-50° C., the spin-coating rate is of 1000-5000 rpm, the spin-coating thickness is of 100-500 nm, the soft-baking temperature is of 80-120° C., and the soft-baking time is of 3-5 minutes. Besides spin-coating, the polymer layer (41) may be formed on the substrate layer (42) through affixing. It is noted that the camera (6) is preferably positioned at a side of the machine platform (5) away from the workpiece (4) for imprint so that the liquid or the volatile gas produced from the mold (2) dissolution can't contaminate the camera (6).

Figure 4:
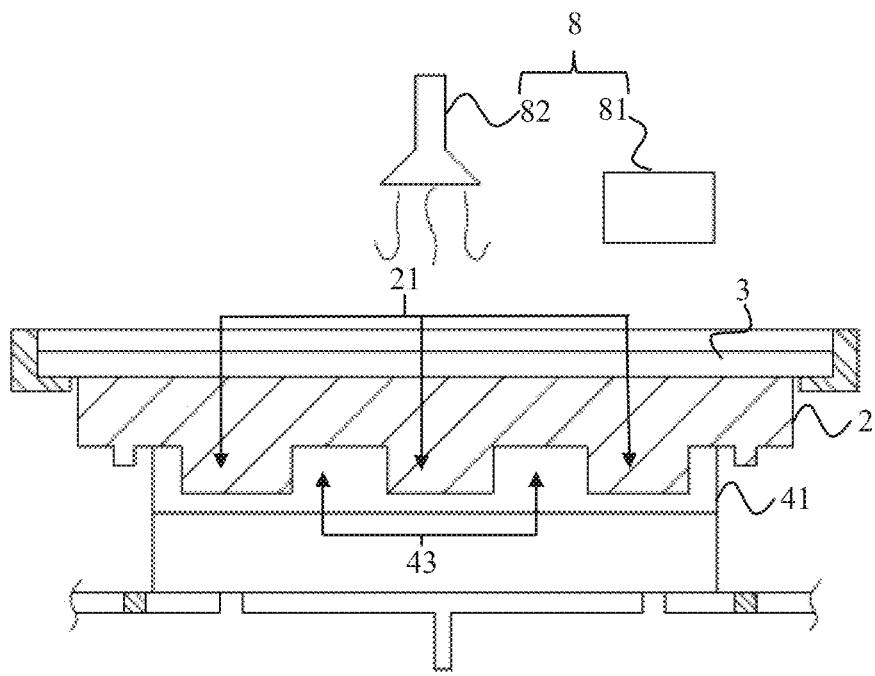

As shown in FIG. 4, an imprint element (8) is used to apply a high temperature and a pressure to the soluble mold (2) to make the polymer layer (41) have an imprint pattern (43) corresponding to the mold pattern (21) and solidified and to dissociate the tape (3). Herein, the high temperature can make the temperature of the polymer material firstly reach its glass transition temperature so that the polymer material can fully flow into the mold pattern (21) accompanied with the pressure; the high temperature can make the polymer material then solidified so that the imprint pattern (43) completely corresponds to the mold pattern (21). In a preferred example, the time for high temperature and pressure applying is of 1-20 minutes. In another preferred example, the high temperature is of 120-150° C. Within the temperature range, while the applying time is of more than 20 minutes, the top portion of the polymer layer (41) may melt to increase the defect possibility for the imprint pattern (43). Moreover, the pressure applying may be performed by applying a positive pressure on a surface of the soluble mold (2) away from the polymer layer (41); by applying a negative pressure on another surface of the soluble mold (2) facing the polymer layer (41); or by simultaneously performing the positive pressure applying and the negative pressure applying. In a preferred example, the positive pressure is of from +20 to +600 kPa, and the negative pressure is of from −10 to −80 kPa. While the positive pressure or the negative pressure is of less than the lower limit value, the polymer material fluidity may decrease to increase the possibility for the imprint pattern (43) incompleteness. It is noted that since the tape (3) is a heat-dissociable tape and its dissociation temperature is of less than the high temperature, preferably of 80-150° C., this high temperature can make the tape (3) dissociated and cease to exist.

Additionally, the imprint element (8) as shown in FIG. 4 comprises a heating element (81) for providing the high temperature and a blowing element (82) for providing the pressure, but not limited thereto.

Figure 5:
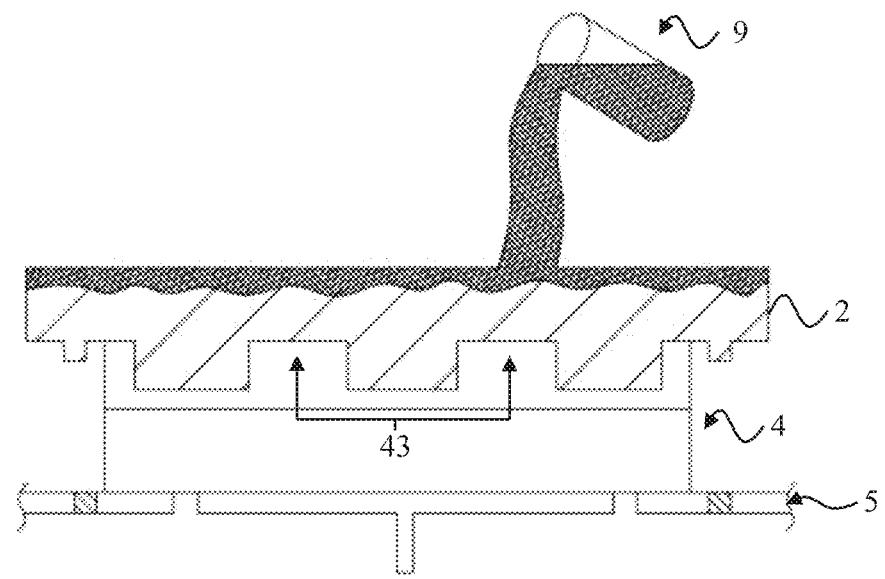
Figure 6:
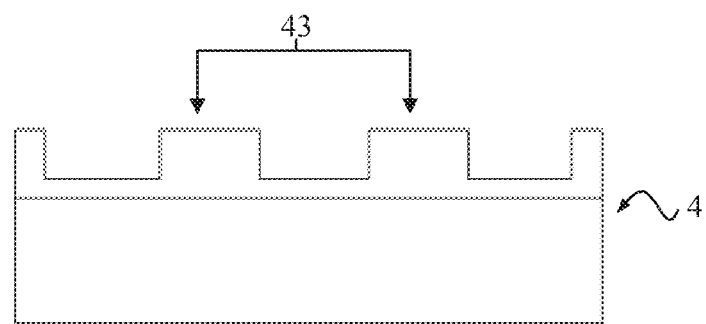

As shown in FIGS. 5-6, a dissolving element (9) is used to provide a solvent to dissolve the soluble mold (2) so that the imprint workpiece (4) having the imprint pattern (43) is obtained. As described above, the solvent dissolution is well-known by people skilled in this art, and therefore there is no need for further description thereon. The solvent species can be determined according to the species of the soluble mold (2); as the soluble mold (2) is made of polyvinyl alcohol, the solvent is, but not limited to, water. Although FIG. 5 shows the solvent dissolution is performed on the machine platform (5), it is a fact that the solvent dissolution may be done out of the machine platform (5).

Figure 9:
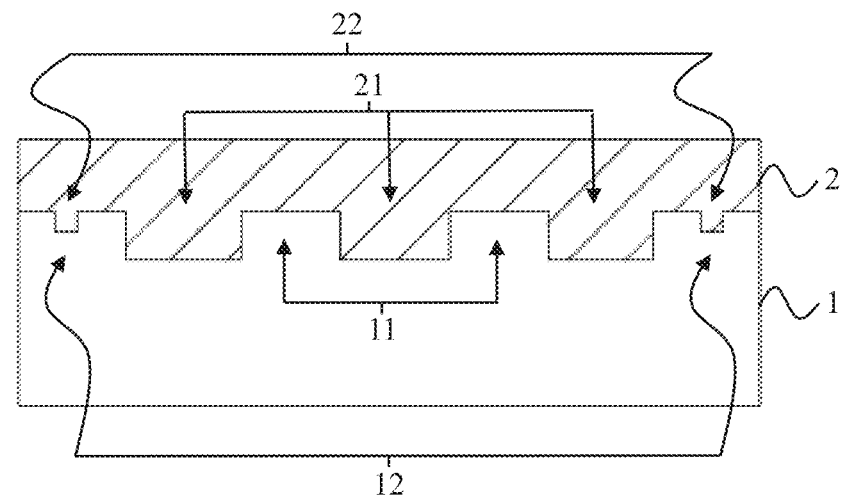
FIGS. 9-16 are a series of cross-sectional views illustrating an imprint method according to another embodiment.

As shown in FIGS. 9-16, an imprint method according to another embodiment is illustrated, wherein the obtained imprint workpiece (4) has an imprint pattern (43). The detailed steps of the exemplary method are described as below:

As shown in FIG. 9, a soluble material is added to a master mold (1) which has a mold structure (11) and a mark structure (12), and then the soluble material is solidified to form a soluble mold (2) which has a mold pattern (21) corresponding to the mold structure (11) and a first alignment mark (22) corresponding to the mark structure (12). In a preferred example, the soluble material is polyvinyl alcohol, and its thickness on the master mold (1) is of 10-1000 μm. Accordingly, the latterly-obtained mold (2) is not only soluble, but also flexible. The soluble material may be added in a solution form, and its concentration in the solution may be of, but not limited to, 5-50 wt %. In case that its concentration is of less than the lower limit value, the probability for making the mold pattern (21) incomplete may increase so that the mold pattern (21) is defective and the imprinting quality lowers. The soluble material may be added through spin coating or slot-die coating, and the spin rate for spin coating may be of, but not limited to, 100-5000 rpm. In a preferred example, the master mold (1) is made of silicon. Additionally, the solidifying used herein may be heat-solidifying or photo-solidifying (e.g. UV-solidifying); the temperature for heat-solidifying may be of 80-160° C. and the time therefor may be of 5-60 minutes, but not limited thereto. In case that the time is of more than the upper limit value, the peeling difficulty for the soluble mold (2) may increase so that the mold pattern (21) is formed with defects.

Figure 10:
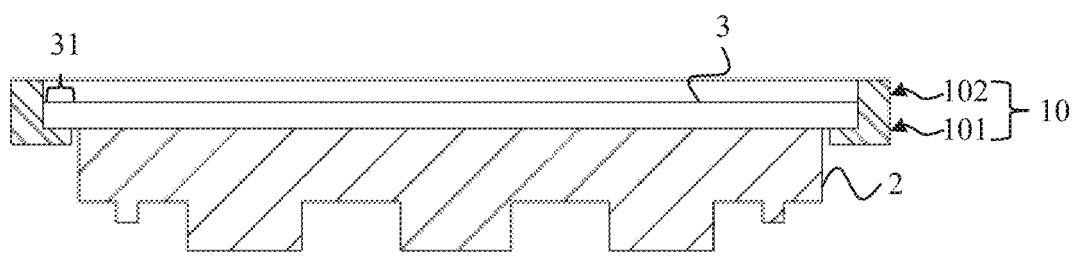
Figure 10:
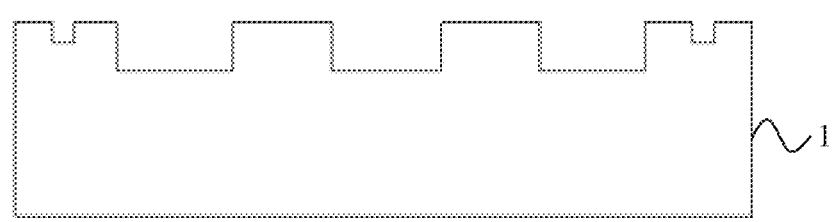

As shown in FIG. 10, a dissociable tape (3) is adhered to the soluble mold (2) and the soluble mold (2) is separated from the master mold (1). The dissociable tape (3) may be, but not limited to, a heat-dissociable tape. In a preferred example, the dissociable tape (3) is made of heat-dissociable foam adhesive, e.g. polystyrene adhesive or polyurethane adhesive, and its thickness is of 100-1000 μm. For conveniently peeling the soluble mold (2), it is preferable that the area of the tape (3) is greater than that of the mold (2) so that a protrusion portion (31) is formed at two ends of the tape (3) for griping. For conveniently peeling the soluble mold (2), before the tape (3) adhering, a ring frame (10) is also used to surround the soluble mold (2), and has a supporting portion (101) and an operating portion (102) connected to each other to form a L-type structure; after the tape (3) attaching, the protrusion portion (31) of the tape (3) is attached to the supporting portion (101) of the ring frame (10), and then a sideways peeling force is applied to the operating portion (102) to remove the mold (2) from the master mold (1).

Figure 11:
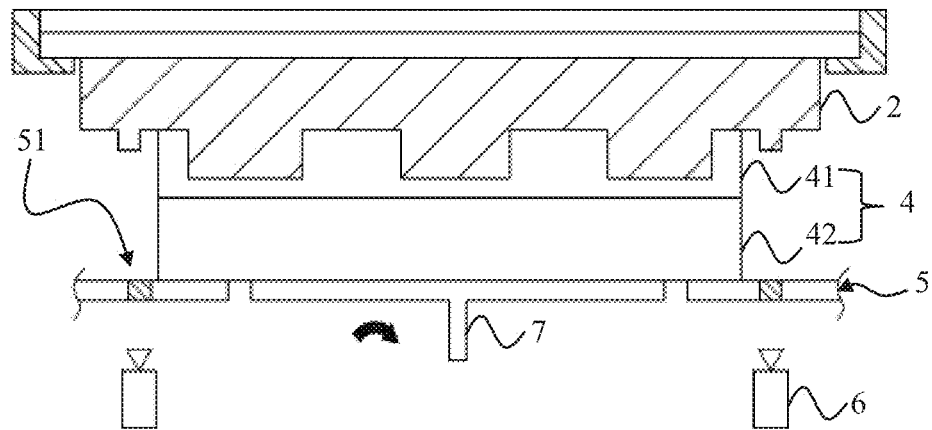

As shown in FIG. 11, the soluble mold (2) is placed onto a polymer layer (41) of a workpiece (4) for imprint. In detail, a substrate layer (42) is placed on a machine platform (5) which has a second alignment mark (51); the polymer layer (41) is then formed on the substrate layer (42); the soluble mold (2) is then positioned onto the polymer layer (41) on the substrate layer (42); finally, a camera (6) is used to determine whether the first alignment mark (22) and the second alignment mark (51) are aligned to each other. If the two alignment marks (22 & 51) are aligned to each other, the following step is performed; however, if not, a position-adjusting element (7) is used to adjust an x-axis position and a y-axis position of the soluble mold (2) and a θ angle formed between the soluble mold (2) and an x-y plane using the machine platform (5) as the x-y plane until the two alignment marks (22 & 51) are aligned to each other. Additionally, a polymer material having a glass transition temperature of less than that of the mold (2) may be coated with spinning onto the substrate layer (42), and then soft baked to form the polymer layer (41). In a preferred example, the glass transition temperature of the polymer material is of 20-50° C., the spin-coating rate is of 1000-5000 rpm, the spin-coating thickness is of 100-500 nm, the soft-baking temperature is of 80-120° C., and the soft-baking time is of 3-5 minutes. Besides spin-coating, the polymer layer (41) may be formed on the substrate layer (42) through affixing. It is noted that the camera (6) is preferably positioned at a side of the machine platform (5) away from the workpiece (4) for imprint so that the liquid or the volatile gas produced from the mold (2) dissolution can't contaminate the camera (6).

Figure 12:
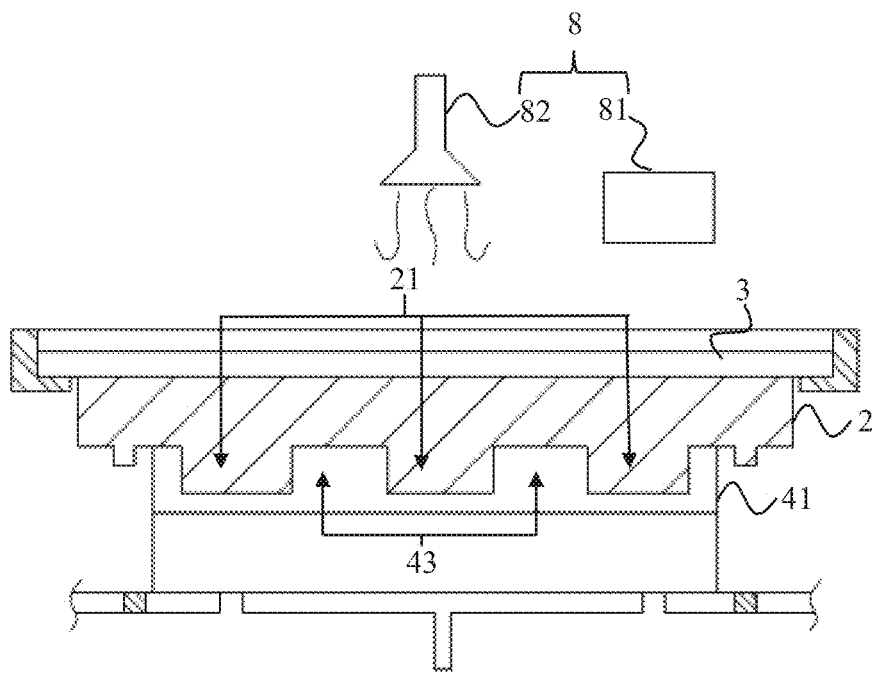
Figure 13:
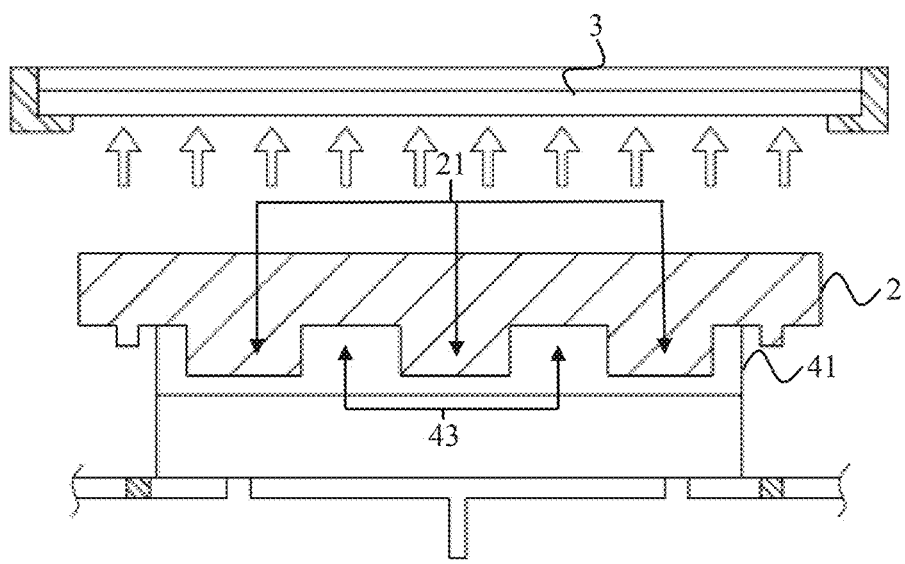

As shown in FIG. 12-13, an imprint element (8) is used to apply a first high temperature and a pressure to the soluble mold (2) to make the polymer layer (41) have an imprint pattern (43) corresponding to the mold pattern (21) and to dissociate the tape (3). Herein, the first high temperature is higher than the glass transition temperature to make the temperature of the polymer material firstly reach its glass transition temperature and then to make the polymer material fully flow into the mold pattern (21) accompanied with the pressure. In a preferred example, the time for first high temperature and pressure applying is of 1-20 minutes. In another preferred example, the first high temperature is of 120-150° C. Within the temperature range, while the applying time is of more than 20 minutes, the top portion of the polymer layer (41) may melt to increase the defect possibility for the imprint pattern (43). Moreover, the pressure applying may be performed by applying a positive pressure on a surface of the soluble mold (2) away from the polymer layer (41);

by applying a negative pressure on another surface of the soluble mold (2) facing the polymer layer (41); or by simultaneously performing the positive pressure applying and the negative pressure applying. In a preferred example, the positive pressure is of from +20 to +600 kPa, and the negative pressure is of from −10 to −80 kPa. While the positive pressure or the negative pressure is of less than the lower limit value, the polymer material fluidity may decrease to increase the possibility for the imprint pattern (43) incompleteness. It is noted that since the tape (3) is a heat-dissociable tape and its dissociation temperature is of less than the first high temperature, preferably of 80-150° C., this first high temperature can make the tape (3) dissociated and cease to exist.

Figure 14:
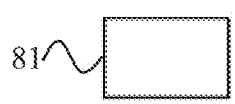
Figure 14:
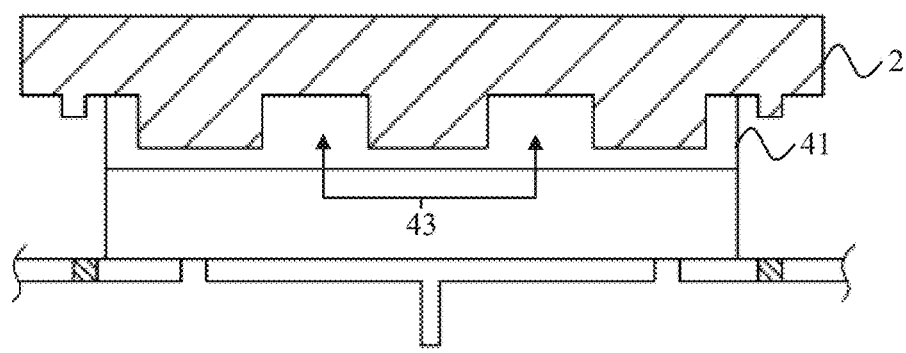

As shown in FIG. 14, the heating element (81) of the imprint element (8) is used to apply a second high temperature to the soluble mold (2) to make the polymer layer (41) solidified, and the second high temperature is higher than the first high temperature. In a preferred example, the second high temperature is of 120-180° C., The second high temperature can make the temperature of the polymer material reach its solidifying temperature so that the polymer material is crosslinked. As such, the elasticity of the polymer layer (41) decreases and its imprint pattern (43) securely and completely corresponds to the mold pattern (21). Especially on condition that the polymer material is made of thermosetting resin, e.g. epoxy resin, the second high temperature can avoid the polymer layer (41) from deformation when the later-obtained imprint workpiece (4) is positioned at a temperature of less than the second high temperature.

Figure 15:
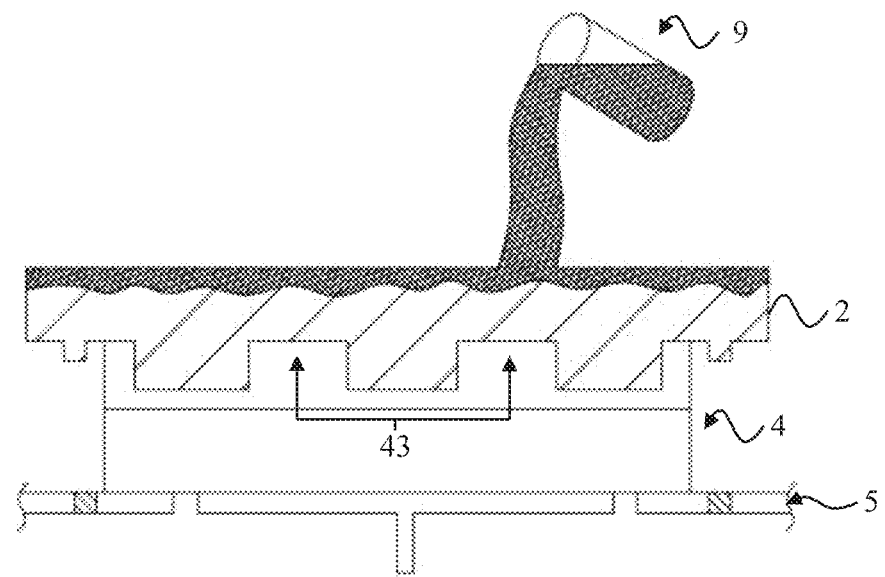
Figure 16:
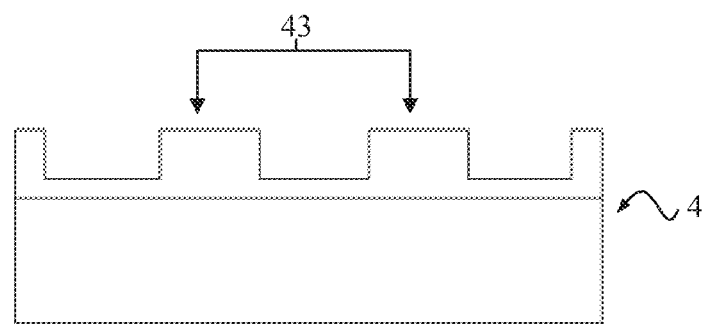

As shown in FIGS. 15-16, a dissolving element (9) is used to provide a solvent to dissolve the soluble mold (2) so that the imprint workpiece (4) having the imprint pattern (43) is obtained. As described above, the solvent dissolution is well-known by people skilled in this art, and therefore there is no need for further description thereon. The solvent species can be determined according to the species of the soluble mold (2); as the soluble mold (2) is made of polyvinyl alcohol, the solvent is, but not limited to, water. Although FIG. 15 shows the solvent dissolution is performed on the machine platform (5), it is a fact that the solvent dissolution may be done out of the machine platform (5).

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An imprint method, comprising:
adding a soluble material to a master mold;
solidifying the soluble material to form a soluble mold having a mold pattern;
adhering a dissociable tape to the soluble mold to separate the soluble mold from the master mold;
placing the soluble mold onto a polymer layer of a workpiece for imprint;
applying a high temperature and a pressure to the soluble mold to allow the polymer layer having an imprint pattern corresponding to the mold pattern and solidification, and to dissociate the tape, wherein the high temperature is of 120-150° C.; and
providing a solvent to dissolve the soluble mold to obtain an imprint workpiece having the imprint pattern.

2. The method as claimed in claim 1, wherein the tape adhering step to the soluble mold comprises:
surrounding the soluble mold with a ring frame, the ring frame having a supporting portion and an operating portion, the supporting portion connected to the operating portion to form a L-type structure;
attaching the dissociable tape to the soluble mold, a protrusion portion of the dissociable tape attached to the supporting portion; and
applying a sideways peeling force to the operating portion of the ring frame to remove the soluble mold from the master mold.

3. The method as claimed in claim 1, wherein the soluble mold has a first alignment mark; the soluble-mold placing step onto the polymer layer comprises:
positioning the workpiece for imprint onto a machine platform, the workpiece further having a substrate layer between the polymer layer and the machine platform, and the machine platform having a second alignment mark;
positioning the soluble mold onto the polymer layer on the machine platform;
determining whether the first alignment mark and the second alignment mark are aligned to each other; and
if the two alignment marks are aligned to each other, performing the high temperature and pressure applying step; or if the two alignment marks are not aligned to each other, adjusting an x-axis position and a y-axis position of the soluble mold and a θ angle formed between the soluble mold and an x-y plane using the machine platform as the x-y plane, until the two alignment marks are aligned to each other.

4. The method as claimed in claim 1, wherein the high temperature and pressure applying step comprises: applying a positive pressure on a surface of the soluble mold away from the polymer layer; or applying a negative pressure on another surface of the soluble mold facing the polymer layer.

5. The method as claimed in claim 1, wherein the dissociable tape is made of a heat-dissociable foam adhesive.

6. The method as claimed in claim 1, wherein the soluble material is polyvinyl alcohol, and the solvent is water.

7. An imprint method, comprising:
adding a soluble material to a master mold;
solidifying the soluble material to form a soluble mold having a mold pattern;

adhering a dissociable tape to the soluble mold to separate the soluble mold from the master mold;

placing the soluble mold onto a polymer layer of a workpiece for imprint;

applying a first high temperature and a pressure to the soluble mold to allow the polymer layer having an imprint pattern corresponding to the mold pattern and to dissociate the tape, wherein the first high temperature is of 120-150° C.;

applying a second high temperature to the soluble mold to allow the polymer layer solidification, the second high temperature higher than the first high temperature, wherein the second high temperature is of 120-180° C.; and providing a solvent to dissolve the soluble mold to obtain an imprint workpiece having the imprint pattern.

8. The method as claimed in claim 7, wherein the tape adhering step to the soluble mold comprises:

surrounding the soluble mold with a ring frame, the ring frame having a supporting portion and an operating portion, the supporting portion connected to the operating portion to form a L-type structure;

attaching the dissociable tape to the soluble mold, a protrusion portion of the dissociable tape attached to the supporting portion; and applying a sideways peeling force to the operating portion of the ring frame to remove the soluble mold from the master mold.

9. The method as claimed in claim 7, wherein the soluble mold has a first alignment mark; the soluble-mold placing step onto the polymer layer comprises:

positioning the workpiece for imprint onto a machine platform, the workpiece further having a substrate layer between the polymer layer and the machine platform, and the machine platform having a second alignment mark;

positioning the soluble mold onto the polymer layer on the machine platform;

determining whether the first alignment mark and the second alignment mark are aligned to each other; and if the two alignment marks are aligned to each other, performing the high temperature and pressure applying step; or if the two alignment marks are not aligned to each other, adjusting an x-axis position and a y-axis position of the soluble mold and a $\theta$ angle formed between the soluble mold and an x-y plane using the machine platform as the x-y plane, until the two alignment marks are aligned to each other.

10. The method as claimed in claim 7, wherein the first high temperature and pressure applying step comprises: applying a positive pressure on a surface of the soluble mold away from the polymer layer; or applying a negative pressure on another surface of the soluble mold facing the polymer layer.

11. The method as claimed in claim 7, wherein the dissociable tape is made of a heat-dissociable foam adhesive.

12. The method as claimed in claim 7, wherein the soluble material is polyvinyl alcohol, and the solvent is water.

* * * * *